(12) United States Patent
Alvis et al.

(10) Patent No.: US 6,455,385 B1
(45) Date of Patent: *Sep. 24, 2002

(54) SEMICONDUCTOR FABRICATION WITH MULTIPLE LOW DOSE IMPLANT

(75) Inventors: Roger L. Alvis, Cupertino; Emi Ishida, Sunnyvale, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,751

(22) Filed: Jan. 7, 1998

(51) Int. Cl.$^7$ ............................................. H01L 21/265
(52) U.S. Cl. ...................................... 438/301; 438/527
(58) Field of Search ................................ 430/514, 527, 430/530, 533; 427/526

(56) References Cited

U.S. PATENT DOCUMENTS

| | | | | |
|---|---|---|---|---|
| 4,575,920 A | * | 3/1986 | Tsuashima .................. | 438/527 |
| 4,584,026 A | * | 4/1986 | Wu et al. .................... | 438/528 |
| 4,851,360 A | * | 7/1989 | Haken et al. ............... | 438/530 |
| 5,145,794 A | * | 9/1992 | Kase et al. .................. | 438/527 |
| 5,385,762 A | * | 1/1995 | Prins ......................... | 427/52 P |
| 5,436,176 A | * | 7/1995 | Shimuzu et al. ............ | 438/527 |
| 5,561,072 A | * | 10/1996 | Saito .......................... | 438/528 |
| 5,750,435 A | * | 5/1998 | Pan ............................. | 438/525 |
| 5,759,904 A | * | 6/1998 | Dearnaley ................... | 438/528 |
| 5,801,078 A | * | 9/1998 | Jimenez ...................... | 438/527 |
| 5,904,551 A | * | 5/1999 | Aronowitz et al. ......... | 438/514 |
| 6,074,937 A | * | 6/2000 | Pramanick et al. ......... | 438/528 |

OTHER PUBLICATIONS

Wolf et al "Silicon Processing For VLSI Era vol./—Process Technology" pp 326–327, Copyright 1986.*

Jamieson et al "Study boron implantation in cadnmium telluride", Material research society symposium proceedings (1988) pp 299–304.*

Mamavar et al loww defect high quality SIMOX materiall for bipolar applications 1988 IEEE SOS/SOI technology workshop p. 19 of 82pp.*

Cho et al, "species and dose dependence of ion implantation dmage induced transient enhanced dffusion" J. Appl. Letts. 79(1) Mar. 1, 1996.*

Bousetta et al "Si Ultrashallow p n Junctions using low–energy boron implantation" appl. Phys. Lett 58(15), Apr. 15, 1991.*

"Dose loss in phosphorus implants due to transient diffusion and interface segregation" by P.B. Griffin, S.W. Crowder and J.M. Knight; Center for Integrated Systems, Stanford University, Stanford, California 94305. Jan. 3, 1995.

* cited by examiner

Primary Examiner—Savitri Mulpuri

(57) ABSTRACT

A method of reducing implant dose loss is provided. The method includes performing multiple low dose implant steps with interspersed anneal steps, thereby avoiding amorphous-silicon formation. The anneal steps may be performed at high temperatures or at low temperatures.

14 Claims, 4 Drawing Sheets

SEMICONDUCTOR FABRICATION WITH MULTIPLE LOW DOSE IMPLANT

BACKGROUND OF THE INVENTION

1. Field of Invention

The invention generally relates to semiconductor fabrication, and specifically, the invention relates to substrate doping.

2. Background

Integrated circuits (ICs) are fabricated under very strict processing conditions to ensure predictable and repeatable circuit behavior. The basic building block of typical IC's is the transistor, and particularly the Metal-Oxide-Silicon (MOS) transistor, which has a relatively rapid switching speed.

Referring to the cross-section of FIG. 1, MOS devices are formed on a substrate 10 with doped regions 12 and 14 forming source and drain regions, respectively. The doped regions create a n-p-n transistor (FIG. 1) or p-n-p transistor (not shown), where the region between the source 12 and drain 14 is known as the "channel" and is generally contained within the boundaries defined by the gate electrode 16 immediately above and separated from the substrate by a dielectric (or insulating region) 18. The channel is electrically separated from the doped regions 12 and 14 by "junctions"—intrinsic, or carrier depleted, regions in the device where the doping concentration of one type of dopant (n or p) in the channel is equal to the doping concentration of the other type of dopant (n or p) in the adjacent source or drain region. In the case of a n-p-n transistor (shown in FIG. 1) carriers from the source-side of the channel are kept from passing through the channel to the drain-side of the channel by the presence of two junctions, namely n-p junction 20 and p-n junction 22.

The distance between junctions across the channel is commonly referred to as the "channel length." As is generally known in the art, channel length is one of the key parameters in determining switching speed in MOS devices. Thus, channel lengths are necessarily shrinking in dimensions to accommodate demands for faster IC's.

While in the past, transistor "critical" dimensions were relatively large compared to so called "normal" variation in channel length (i.e., junction positioning), current state-of-the-art technology is much more sensitive to the absolute position of the junctions. For example, a 200 Å channel length variation in a 0.25 micron transistor will have a more significant effect than for the same channel length variation in a 2 micron transistor.

Besides natural variation in junction position, the device designer must consider variation in junction position arising from processing. Such processing induced variation may arise from a difference in the level of doping in the source or drain, or even the channel doping. However, for a fixed channel doping level, the relative amount of doping in the source and drain essentially determines the position of the junctions. If by some mechanism, the doping concentration profile, in the source or drain for example, is different than specified by the designer, the device will behave considerably different than expected. Besides misprocessing, one of the best-known physical mechanisms for unpredictably altering a doping profile is "transient enhanced diffusion" (TED). Another such mechanism, albeit much less understood than TED is "dose-loss", which refers to the apparently unpredictable "loss" of dopant from specified areas such as sources or drains. From a device designer's perspective, dose loss increases the channel length and decreases the switching speed, while from a process development point-of-view, dose loss increases the resistivity of the doped silicon, possibly beyond an acceptable level. Thus, the elimination, or minimization of dose loss is an important step toward developing a process to reliably increase the speed of today's integrated circuits.

FIGS. 2 and 3 will be used to further illustrate dose loss. FIG. 2 shows a cross-sectional view of a crystalline substrate 100. In conventional implantation techniques, dopants 114 are implanted into substrate 100 as indicated by arrows 112. However, typically subsequent to the implantation step, an anneal (or high temperature treatment) step is generally performed. An anneal is generally a mandatory step in the semiconductor processing domain as an anneal will repair damage to the substrate 100 caused by the implant and activate the doped regions. The dopants tend to diffuse during the anneal steps, and dopants close to the substrate surface may evaporate or diffuse into the surrounding ambient atmosphere.

Often, as shown in FIG. 3, a screen oxide 110 is grown or deposited on top of substrate 100 prior to implantation in many conventional processes. Dopants 114 are then implanted through the screen oxide 110 into the substrate 100 as shown by arrows 112. The screen oxide is useful for reducing dopant "channeling" and confining implant contaminants. However, some of the implant dose remains in the screen oxide 110. Moreover, as in the anneal step described with respect to FIG. 1, although the screen oxide may prevent some dopant "evaporation" into the ambient atmosphere, dopants may still diffuse into the screen oxide so that when the screen oxide is stripped to remove contaminants, a considerable portion of the implanted dose will be lost as well. Thus, dose loss will often occur after an anneal wherein the dopants tend to move from the substrate to the layer adjacent the substrate surface, be that layer the ambient atmosphere, a screen oxide, or otherwise. Such evaporation and/or diffusion can cause a loss of even 50% of the implanted dose.

Dose loss, as described above, has been documented in Griffin, Crowder, and Knight, "Dose Loss in Phosphorous Implants Due to Transient Diffusion and Interface Segregation," Center for Integrated Systems, Stanford University (Jan. 3, 1995).

Not only does dose loss cause a reduction in dopant concentration in the substrate, but it can also pollute layers that are subsequently formed over the substrate, for instance, the gate oxide, which needs to be as pure as possible for device reliability. Moreover, as mentioned above, controlling the dose and spatial distribution of the dopant in the substrate is critical to device performance and, in particular, is important because dose loss, when unaccounted for, can lead to unpredictable device performance.

SUMMARY OF THE INVENTION

In order to reduce implant dose loss due to evaporation and thermal processes, such as anneal steps, a process in accordance with the invention is disclosed. The process generally entails performing multiple low dose implants with interspersed anneal steps. The anneal steps can be performed at low temperatures in some embodiments of the invention, or at higher temperatures, such as with RTA processes, in other embodiments of the invention. By using a process in accordance with the invention, device reliability and performance will improve, allowing faster integrated circuits to be developed.

BRIEF DESCRIPTION OF THE DRAWINGS

The present invention is described with respect to particular exemplary embodiments thereof, and reference is accordingly made to the drawings (which are not necessarily drawn to scale), in which.

DETAILED DESCRIPTION

A process in accordance with the invention reduces implant dose loss, and thus increases implant dose retention in a substrate, thereby forming more reliable and faster semiconductor devices. Such a process generally involves several low dose implant sub-steps with interspersed anneal steps. A process in accordance with the invention is based on the premise that amorphous-silicon is preferred by dopants over crystalline silicon. This premise and more details with regard to the invention are further discussed below.

As is generally known in the semiconductor process art, ion implantation will typically damage the crystalline structure of the substrate (the bombardment of ions on the substrate surface will cause the substrate's crystalline lattice structure to break down). When the dose of the implant is high enough and at certain energy levels, it will result in amorphization of an upper portion of the substrate, typically formed with silicon. While crystalline silicon has a regular lattice structure, amorphous silicon lacks such a lattice structure.

Figure 1:
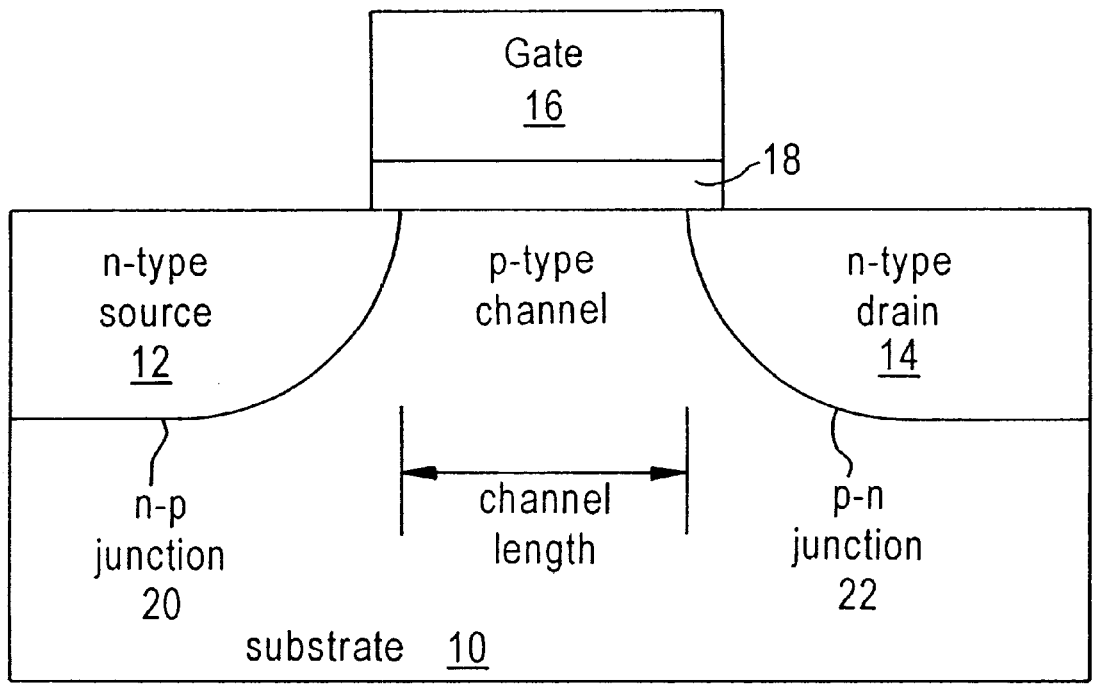
FIG. 1 is a cross-sectional view of a MOSFET device.
Figure 2:
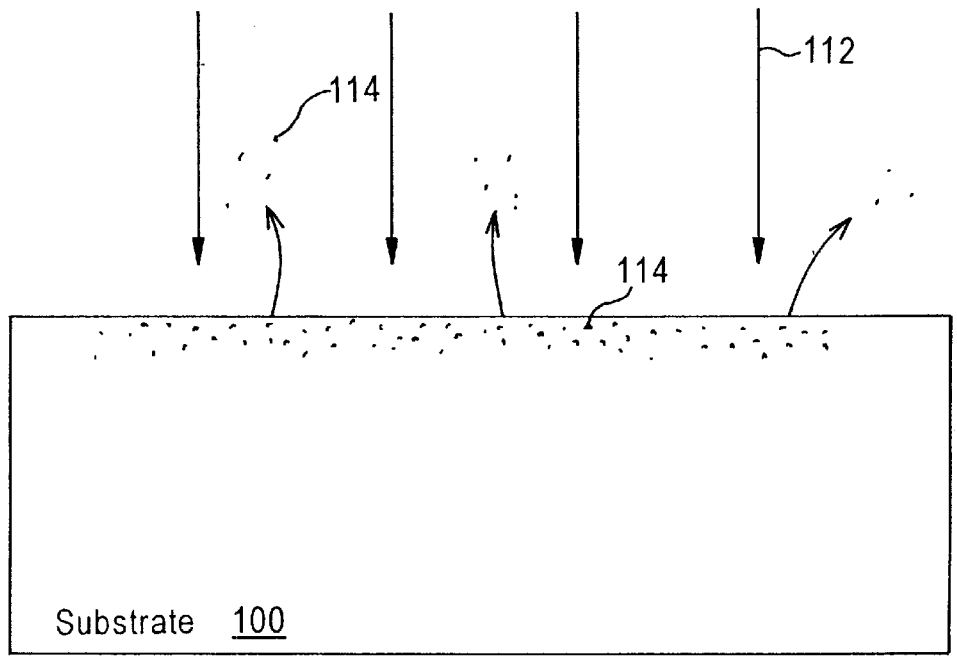
FIG. 2 is a cross-sectional view of a substrate implanted with dopants and demonstrating evaporation.
Figure 3:
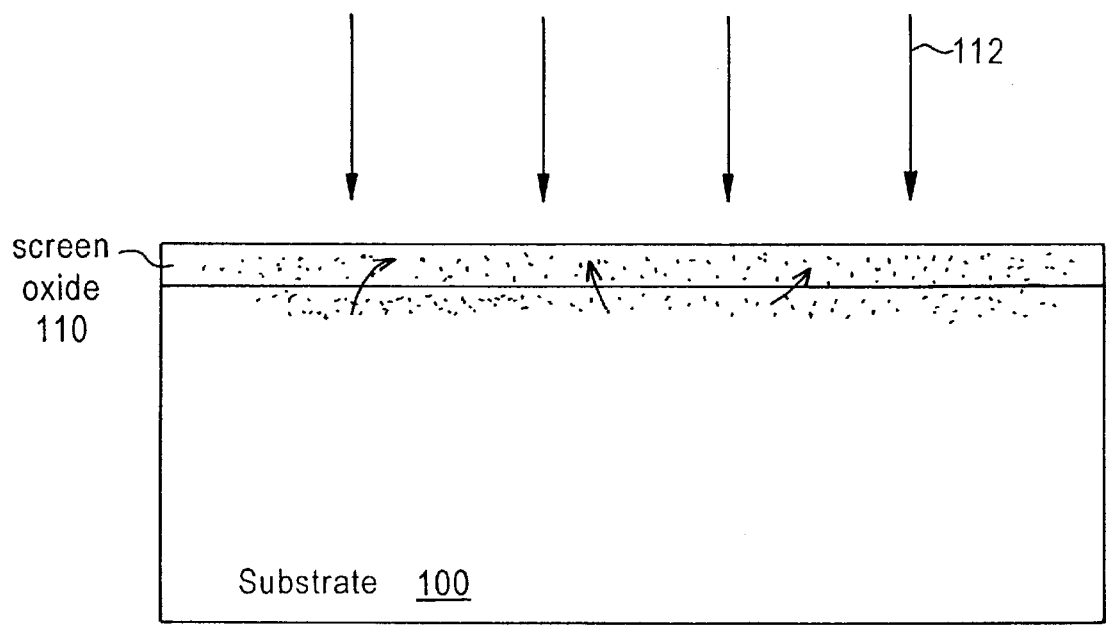
FIG. 3 is a cross-sectional view of a substrate implanted with dopants through a sacrificial oxide.
Figure 4:
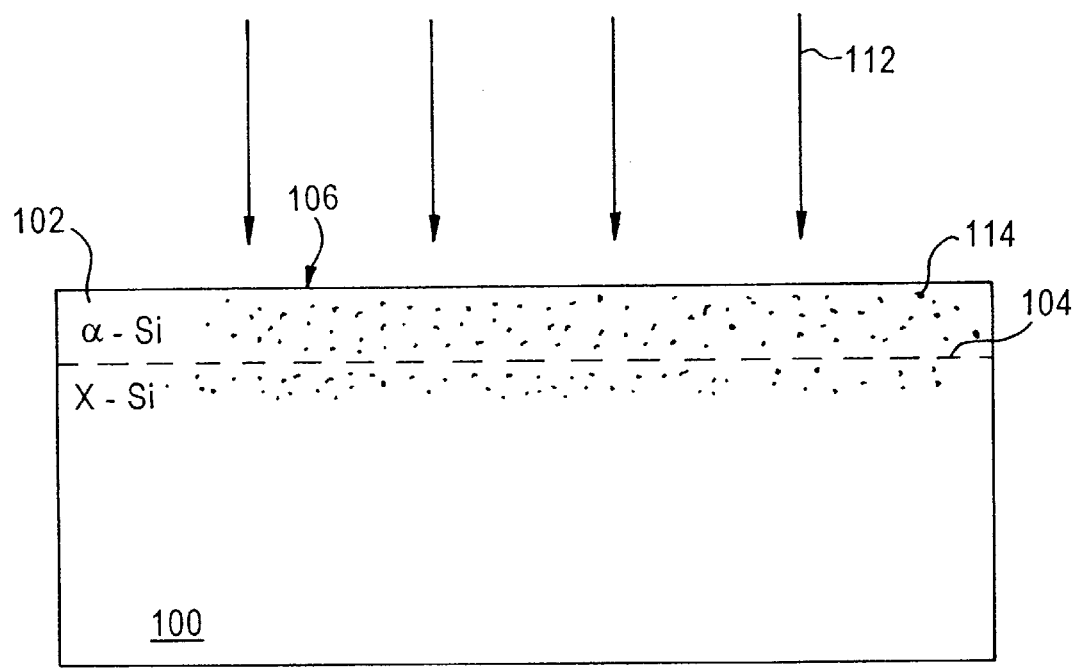
FIG. 4 is a cross-sectional view of a substrate implanted with dopants and having an amorphous silicon region.

The cross-sectional view of silicon substrate after implantation having a crystalline silicon (x-si) region 100 and an amorphous silicon region (α-si) 102 is shown in FIG. 4. Following ion implantation, represented by arrows 112, an anneal step is typically performed under conditions to ensure the repair of damage to the substrate, including the recrystallization of the amorphized silicon. Recrystallization is believed to occur via the process known as solid phase epitaxy ("SPE"). SPE can be realized in any number of processing environments, including rapid thermal anneal ("RTA") and furnace annealing. Recrystallization generally starts at the amorphous-silicon/crystalline-silicon boundary 104, gradually moving up toward the substrate surface 106, at which point the amorphous-silicon region 102 will have been entirely recrystallized and encompassed within crystalline-silicon region 100.

As is known outside of the semiconductor process art, e.g., in metallurgy and silicon wafer fabrication, some impurities prefer the liquid phase of an element as opposed to a solid phase of an element. For instance, zone refining is a known technique for removing impurities from crystalline silicon. A portion of a rod-shaped piece of silicon is heated by a furnace so that the heated portion of the silicon liquifies. The heat is gradually moved from one end of the rod to the other end. As the heat is moved down the rod, the "melt" (liquid) region is also moved down the rod. Once liquified, impurities. in the melt region tend to stay in the melt region, moving down the rod with the melt region. For instance, as the melt region is moved from a first location to a second location, the impurities in the first location will move with the liquid region to the second location, leaving behind crystalline silicon with a substantially lower concentration of impurities. Thus the concentration of impurities in the melt region of the rod increases as the melt region is moved down the rod. When the melt cycle through the rod is complete, one end of the rod will have a higher impurity concentration and can be sliced off of the rod.

Figure 5:
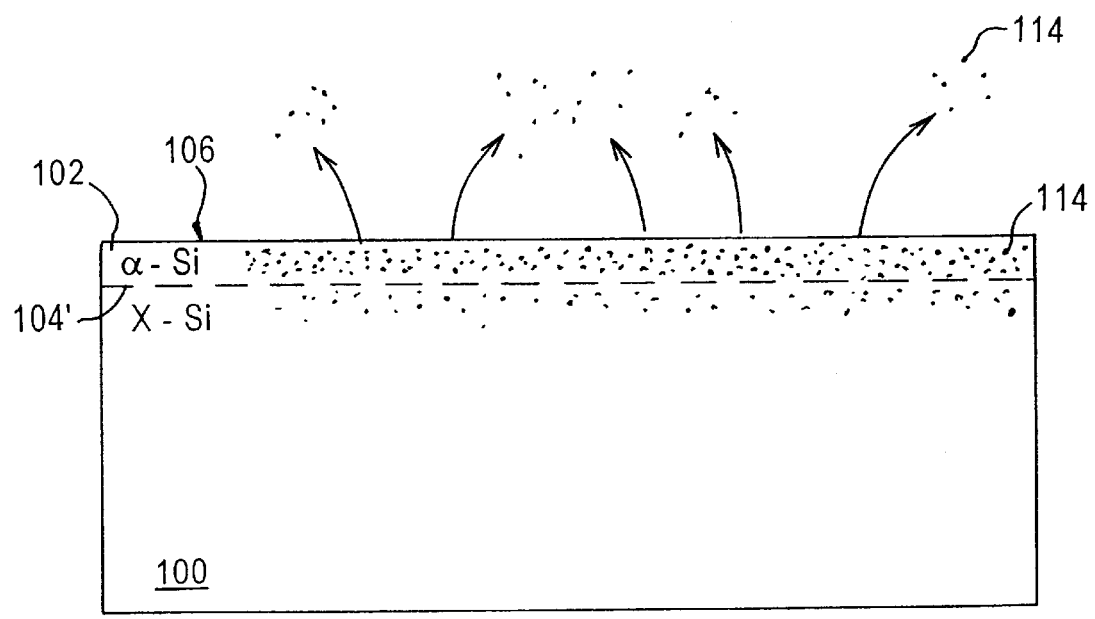
FIG. 5 is a cross-sectional view of the substrate of FIG. 4 having a partially recrystallized amorphous silicon region.
Figure 6A:
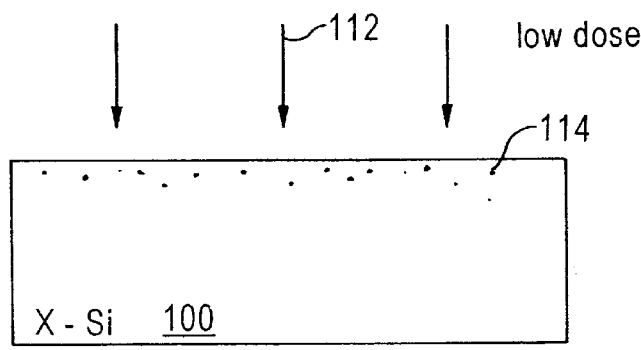
FIG. 6, including FIGS. 6A–6D, demonstrates the steps in a process according to one embodiment of the invention.
Figure 6B:
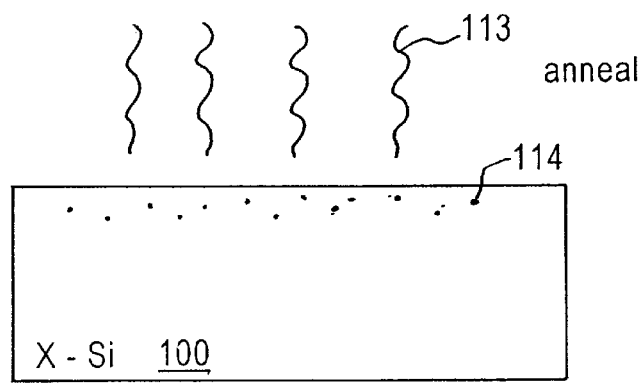
Figure 6C:
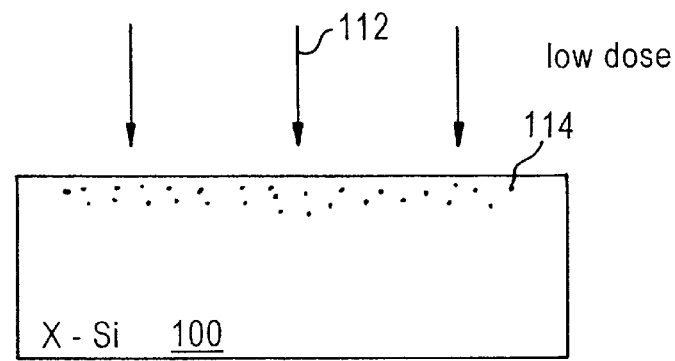
Figure 6D:
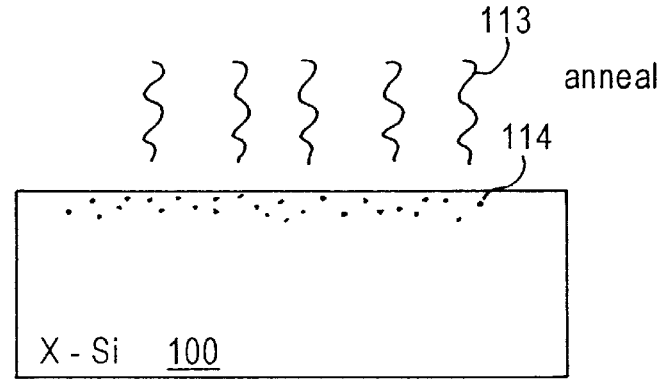

Despite the knowledge of zone refining in other industries outside of the semiconductor process art, those of skill in the semiconductor process art have had no reason to consider dopant or impurity solubility in liquid phases as semiconductor process engineers only work with elements in their solid and gaseous states. Nonetheless, the inventors of the present invention believe that amorphous-silicon can be analogized to a liquid: since the amorphous silicon lacks any lattice structure, it is similar in many respects to a thick and slow-moving liquid. Thus, much as in zone refining, the inventors believe that the dopants in the silicon will prefer to remain in the amorphous-silicon portion 102 of the substrate over the crystalline portion 100. The cross-sectional view of FIG. 5 shows the structure of FIG. 4 where the amorphous region 102 has been partially recrystallized (thus FIG. 5 shows new boundary 104'). The inventors believe that during anneal steps, when amorphous silicon begins recrystallizing at boundary 104, the dopants will tend to remain in amorphous-silicon region even as the region 102 becomes smaller. Thus, as boundary 104 moves closer to surface 106 during recrystallization, dopants will concentrate in the amorphous-silicon region, and thus be moved toward the substrate surface 106. Such a concentration of dopants near surface 106 will result in increased loss of dopants from the silicon substrate.

Nonetheless, there are processing regimes where implants may not cause an amorphous-silicon region to form. In fact, every energy and dopant species will have a dose threshold above which the crystalline silicon will amorphize, but below which no amorphization of the substrate will take place. Therefore, to increase dopant dose retention, a method in accordance with the present invention uses multiple consecutive dopant implants, where each implant is performed at a low dose—a non-amorphizing implant dose, which is below the amorphizing threshold. In between each implant step, an anneal step is performed to repair damage done to the crystalline-silicon. Thus, each implant step starts essentially with a crystallized substrate (although there may still be a small number of defects in the substrate). The number of multiple consecutive implants to be performed will of course vary depending on the ultimate implant dose desired.

For example, if arsenic (As) is used as a dopant at an energy of 20–40 KeV, the amorphizing threshold is approximately $5 \times 10^{14}$–$1 \times 10^{15}$ atoms/cm$^2$. If an implant dose above the amorphizing threshold is required, then several implant sub-steps will be taken in accordance with the invention. The dose implanted by each sub-step will be additive to the dose level previously implanted. Hence, the number of sub-steps taken can be varied according to the properties of addition. So, for example, to achieve an implant dose of As of $2 \times 10^{15}$ atoms/cm$^2$, eight implant steps at $2.5 \times 10^{14}$ atoms/cm$^2$ can be performed. Alternatively, six implant steps at $3 \times 10^{14}$ atoms/cm$^2$ followed by an implant step at $2 \times 10^{14}$ atoms/cm$^2$ can be performed. As should be clear to those of skill in the art, the number of steps and the dose of dopants implanted in each step can be varied in a myriad of ways.

In between each low dose implant step, an anneal step is performed to repair crystal damage. The anneal step can either be at a low temperature or a high temperature. For instance, a low temperature such as 450°–650° C. performed for 30–60 minutes can be used and is a typical furnace anneal often used for SPE. Such a furnace anneal will repair crystal damage, but will not necessarily activate or diffuse dopants significantly. Alternatively, a high temperature anneal can be performed, e.g., 800–1075° C. for 10–40 seconds, often typical of rapid thermal anneal (RTA) processes. Such high temperature anneal processes will tend not only to repair crystal damage, but will also tend to activate dopants. As should be clear to those of skill in the art, the anneal temperatures and times used can vary among embodiments of the invention provided crystal damage is repaired so as to avoid amorphization with a subsequent implant sub-step. In one embodiment of the invention low temperature anneals are done in between the implant steps until the total desired implant dose is achieved. Then, for the last anneal step, following the final implant step, a high temperature anneal is performed (e.g., RTA).

FIG. 6 is demonstrative of a process in accordance with the invention. FIG. 6a demonstrates a low dose implant (e.g., one below the amorphizing threshold for the dopant species and energy used) into the crystalline substrate 100. FIG. 6b demonstrates an anneal process following the low dose implant of FIG. 6a, where squiggly lines 113 represent heat. Following the steps in FIG. 6b, a second low dosage implant will be performed, as shown in FIG. 6c. This second low dose implant can be for the same dose as used for the first low dose implant or can be different, as discussed above. Again, in FIG. 6d, an anneal step follows the implant step of FIG. 6c. Low dose implant and anneal steps then continue to be performed in an alternating manner until the desired implant dose is reached.

Because a process in accordance with the invention avoids forming an amorphous silicon layer 102, dopants will not segregate preferentially toward and concentrate near the substrate surface 106. Thus, while there may still be a small amount of loss of dopants from near the surface by conventionally described evaporation and/or diffusion mechanisms, dose loss will be significantly reduced over conventional methods that attempt to achieve implant doses above the amorphizing threshold with a single implant.

It should be understood that the particular embodiments described above are only illustrative of the principles of the present invention, and various modifications could be made by those skilled in the art without departing from the scope and spirit of the invention. For instance, various embodiments of the invention may use several consecutive low dose implants, without an anneal step in between each implant sub-step, provided no amorphization takes place. An anneal step can then be performed following the low dose implants and then additional low dose implants can follow. Moreover, while embodiments of the invention have been herein described with reference to a silicon substrate, other embodiments of the invention can use substrate materials other than silicon. Thus, the scope of the present invention is limited only by the claims that follow.

What is claimed is:

1. A method of fabricating a semiconductor device on a silicon substrate, including the steps of:

implanting a dopant at an energy level into said silicon substrate for forming source/drain region, which is essentially crystallized, using multiple implant steps wherein respective doses of each said multiple implant step is below an amorphizing threshold determined by said dopant and said energy level, and wherein a sum of said respective doses from said multiple implant steps is greater than or substantially equal to said amorphizing threshold; and interspersing anneal steps among said multiple implant steps, thereby forming a dopant impurity region extending from an upper surface of said silicon substrate.

2. The method according to claim 1, comprising:

implanting the same dopant species using multiple implant steps; and performing said anneal step at a low temperature.

3. The method of claim 1, comprising:

implanting the same dopant species using multiple implant steps; and performing said anneal steps at a high temperature.

4. A method of fabricating a semiconductor device on a silicon substrate, including the sequential steps of:

(a) introducing a dopant, at an energy level, into said silicon substrate, which is essentially crystallized, at a non-amorphizing dose below an amorphizing threshold determined by said dopant and said energy level for forming source/drain region;

(b) repairing damage to said substrate;

(c) repeating steps (a) and (b) until a total additive dose resulting from said introducing steps is greater than or substantially equal to said amorphizing threshold, said total additive dose being a sum of all said non-amorphizing doses, thereby forming a dopant impurity region extending from an upper surface of said silicon substrate.

5. The method of claim 4, wherein:

said step of introducing includes ion implanting said low dose; and said step of repairing includes annealing said substrate.

6. The method of claim 5, comprising:

ion implanting the same dopant species using multiple ion implanting steps; and performing step (b) at a low temperature.

7. The method of claim 6, wherein said low temperature is approximately 450–650° C.

8. The method of claim 5, wherein said step (b) is performed n times, where the first n−1 times said step (b) is performed at a low temperature, and the nth time said step (b) is performed at a high temperature.

9. The method of claim 5, comprising:

ion implanting the same dopant species using multiple ion implanting steps; and performing said step (b) at a high temperature.

10. The method of claim 9 wherein said high temperature is approximately 800–1075° C.

11. The method according to claim 1, wherein said dopant is arsenic.

12. The method according to claim 4, wherein said dopant is arsenic.

13. The method according to claim 3, comprising performing said anneal steps at a high temperature for about 10 seconds to about 40 seconds.

14. The method according to claim 9, comprising performing said steps (b) at a high temperature for about 10 seconds to about 40 seconds.

* * * * *